US007319071B2

(12) United States Patent
Hineman et al.

(10) Patent No.: US 7,319,071 B2
(45) Date of Patent: Jan. 15, 2008

(54) METHODS FOR FORMING A METALLIC DAMASCENE STRUCTURE

(75) Inventors: Max F. Hineman, Boise, ID (US); Stephen W. Russell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 317 days.

(21) Appl. No.: 10/767,764

(22) Filed: Jan. 29, 2004

(65) Prior Publication Data

US 2005/0170642 A1 Aug. 4, 2005

(51) Int. Cl.
*H01L 21/44* (2006.01)
(52) U.S. Cl. .............. 438/687; 438/584; 438/597; 257/E21.579
(58) Field of Classification Search .............. 257/734, 257/741, 750, 762; 438/687
See application file for complete search history.

(56) References Cited

U.S. PATENT DOCUMENTS

| 6,204,192 | B1 |   | 3/2001  | Zhao et al.     |
|-----------|----|---|---------|-----------------|
| 6,270,353 | B1 | * | 8/2001  | Andrews et al.  |
| 6,319,842 | B1 |   | 11/2001 | Khosla et al.   |
| 6,424,042 | B1 | * | 7/2002  | Kitani          |
| 6,465,352 | B1 | * | 10/2002 | Aoki            |
| 6,534,397 | B1 |   | 3/2003  | Okada et al.    |
| 6,645,852 | B1 | * | 11/2003 | Taguchi et al.  |
| 6,885,080 | B2 | * | 4/2005  | Chen et al.     |

| 2001/0034127 | A1 | * | 10/2001 | Yamasaki et al. |
|--------------|----|---|---------|-----------------|
| 2001/0049181 | A1 |   | 12/2001 | Rathi et al.    |
| 2002/0030215 | A1 | * | 3/2002  | Oashi et al.    |
| 2002/0098685 | A1 |   | 7/2002  | Sophie et al.   |
| 2002/0167089 | A1 |   | 11/2002 | Ahn et al.      |
| 2003/0022509 | A1 |   | 1/2003  | Rathi et al.    |

FOREIGN PATENT DOCUMENTS

WO      WO 99/60601      11/1999

OTHER PUBLICATIONS

Eisenbraun et al., "Selective and Blanket Low Temperature Copper CVD for Multilevel Metallization," Materials Research Society Conference Proceedings, ULSI VII, 397 401 (1992).

(Continued)

*Primary Examiner*—Leonardo Andujar
*Assistant Examiner*—Kevin Quinto
(74) *Attorney, Agent, or Firm*—TraskBritt

(57) ABSTRACT

In damascene process integration, a reducing plasma is applied after the etch stop or barrier layer is opened over a copper layer. Currently known methods for opening barrier layers suffer from the disadvantage that they cause at least some of the underlying copper to oxidize to copper oxide. Because copper oxide is selectively removed by subsequent wet cleaning, voids can form where damaged copper (e.g., copper oxide) is removed, thus compromising the reliability of metal-to-metal contact in vias. The present invention advantageously overcomes this and other disadvantages of the prior art through the use of a hydrogen plasma following the barrier layer opening step, which repairs damaged copper (e.g., reduces copper oxide to copper), thus preventing and/or diminishing defects in metal-to-metal contacts in vias and concomitantly improving the reliability of the same.

25 Claims, 8 Drawing Sheets

OTHER PUBLICATIONS

Klaus, J. W. et al., "Atomic Layer Deposition of Tungsten Nitride Films Using Sequential Surface Reaction," Journal of Electrochemical Soc., 147:3, 1175 81 (2000).

Kaloyeros et al., "Blanket and Selective Copper CVD From Cu(fod)2 For Multilevel Metallization," Mat. Res. Soc. Symp. Proc., vol. 181 (1990).

Shacham-Diamand et al., "Copper Electroless Deposition Technology for Ultra Large Scale Integration (ULSI) Metallization," Microelectronic Engineering, vol. 33, pp. 47-48 (1997).

Zheng et al., "Polymer Residue chemical Composition Analysis and its Effect on Via Contact Resistance in Dual Damascene Copper Interconnects Process Integration," Microelectronics Journal, vol. 34 (2003), pp. 109-113.

* cited by examiner

METHODS FOR FORMING A METALLIC DAMASCENE STRUCTURE

BACKGROUND OF THE INVENTION

The present invention relates generally to the field of semiconductor device fabrication and, more particularly, to methods for improving metal-to-metal contact in vias by decreasing and/or repairing damage to metal layers during formation of damascene structures in semiconductor devices.

The integration of a large number of components on a single integrated circuit (IC) chip requires complex interconnects. Ideally, the interconnect structures should be fabricated with minimal signal delay and optimal packing density. The reliability and performance of integrated circuits may be affected by the quality of their interconnect structures. Advanced multiple metallization layers have been used to accommodate higher packing densities as devices shrink below sub-0.25 micron design rules. One such metallization scheme is a dual damascene structure formed by a dual damascene process. The dual damascene process is a sequential mask/etch process to form a two-level structure, such as a via connected to a metal line situated above the via.

In contrast to a single damascene process, the via and the trench are simultaneously filled with metal. Thus, compared to the single damascene process, the dual damascene process offers the advantage of process simplification and low manufacturing cost.

To improve the performance, reliability and density of the interconnects, the microelectronics industry has recently begun migrating away from the use of aluminum (Al) and/or its alloys for the interconnects. As such, advanced dual damascene processes have begun using copper (Cu) as the material of choice because copper has high conductivity, extremely low resistivity (about 1.7 μΩcm) and good resistance to electromigration. One difficulty encountered with copper is that copper-to-copper connections between the first level interconnect metal layer and a copper via-filling plug are subject to reliability problems due to chemical and physical damage to the first level interconnect metal layer during formation of the dual damascene structure.

FIGS. 1A-1C illustrate a sequence of fabrication steps for a known dual damascene process as applied to interconnect formation. As shown in FIG. 1A, the process begins with the deposition of a first insulating layer 140 over a first level interconnect metal layer 120, which in turn is formed over or within a semiconductor substrate 100. A second insulating layer 160 is next formed over the first insulating layer 140. Etch stop layers 150, 150' are typically formed between the first and second insulating layers 140, 160 and between the first insulating layer 140 and the first level interconnect metal layer 120. The second insulating layer 160 is patterned by photolithography with a first mask (not shown) to form a trench 170 corresponding to a metal line of a second level interconnect. The etch stop layer 150 prevents the upper level trench 170 from being etched through to the first insulating layer 140.

As illustrated in FIG. 1B, a second masking step followed by an etch step is applied to form a via 180 through the etch stop layer 150 and the first insulating layer 140. The second etch stop layer or barrier layer 150' is formed between the first level interconnect metal layer 120 and the first insulating layer 140 during the formation of the dual damascene structure 125. Thus, a further step is required to open barrier layer 150' and expose the underlying first level interconnect metal layer 120. After the etching is completed, both the trench 170 and the via 180 are filled with metal 122 (also referred to as via-filling plug 122), which is typically copper (Cu), to form a damascene structure 125, as illustrated in FIG. 1C.

FIGS. 1D-1F depict one problematic result that arises with known damascene processing techniques. Among other contaminants, copper oxide 121 is formed in the first level interconnect metal layer 120 by the oxidizing etchants conventionally used to open barrier layer 150', as shown in FIG. 1D. Such damage to first level interconnect metal layer 120 often further includes undercutting (i.e., removal of material from first level interconnect metal layer 120 under barrier layer 150') of the first level interconnect metal layer 120 near the edges of barrier layer 150' (see also FIG. 1F). Copper oxide and other contaminants must be removed prior to formation of the via-filling plug 122, which is typically accomplished with a wet clean process. As shown in FIGS. 1E-1F, removal of copper oxide 121 in such a wet clean process sometimes causes voids 127 to occur during formation of the via-filling plug 122. Such voids 127 compromise the reliability of the electrical connection between plug 122 and the first level interconnect metal layer 120 and are particularly likely to occur near or under the edges of the barrier layer 150', as shown in FIGS. 1E-1F.

FIG. 1F is a detail view of region 190 shown in FIG. 1E. FIG. 1F shows the aforementioned undercutting of first level interconnect metal layer 120 near the edges of barrier layer 150', as well as voids 127 that can form due, at least in part, to such undercutting.

In the past, hydrogen plasmas have been used after the wet clean process described above. However, such an approach is disadvantageous because the wet clean process selectively removes copper oxides 121 from first level interconnect metal layer 120, thus giving rise to greater potential for incidence of voids 127 and other anomalies in subsequently formed metal-to-metal contacts, e.g., between via-filling plug 125 and first level interconnect metal layer 120. The present invention advantageously overcomes this problem by at least partly reducing copper oxide to copper before the wet clean process, thus reducing the amount of copper material removed by the wet clean process and concomitantly improving the reliability of subsequently formed metallic connections.

As mentioned above, copper interconnect is the most promising metallization scheme for the future generation high-speed ULSI, primarily because of lower electrical resistivity (1.7 vs. 2.3 μΩcm) and electro/stress-migration resistance than the conventional aluminum-based materials. However, copper metallization suffers from disadvantages, including those described above. As a result, in order to adopt copper interconnects for ULSI, suitable methods for improving the reliability of copper-to-copper contact in vias are needed.

As mentioned above, of the several schemes proposed for fabricating copper interconnects, the most promising method appears to be the dual damascene process shown in FIGS. 1A-1C. Using this method, the trenches for conductors and holes for vias are patterned in blanket dielectrics, and then the desired metal is deposited into the trenches and holes in one step. Chemical mechanical planarization (CMP) is conventionally used to remove the unwanted surface metal extending over the uppermost dielectric, while leaving the desired metal in the trenches and vias. This leaves a planarized surface for subsequent metallization to build multilevel interconnect structures. Unfortunately, this technology not only uses a large amount of expensive consumables for the CMP process and the associated waste disposal problem but also is very wasteful of copper. Typically, the conductors and vias in a given metallization level occupy only a small proportion of the deposited copper, while the bulk of the copper is removed by CMP, rendering the technology very expensive. There is thus a strong economic incentive to minimize waste wherever possible, and losses that can occur due to defective metal-to-metal contact in vias are especially onerous because they occur and/or are discovered only after substantial fabrication is complete.

The ordinarily skilled artisan will readily appreciate that a number of processes are known for forming dual damascene structures. For instance, trenches may be etched through the upper insulating layer, after which a further mask may be employed to etch the contact vias, or the etch continues through a previously defined, buried hard mask (the so-called "trench first" approach). Alternatively, vias may first be etched through the upper and lower insulating layers, after which the via in the upper insulating layer may be widened to form a trench (the so-called "via first" approach). The "via first" dual damascene approach has been widely adopted for small geometry devices.

Due to the disadvantageous results (as depicted in FIGS. 1E-1F) that can arise in conventional damascene techniques, great care is taken to minimize physical and chemical damage to the first level interconnect metal (copper) layer 120. Nevertheless, known damascene techniques still frequently result in formation of voids 127, which are undesirably detrimental to the integrity of the electrical connection between the first level interconnect metal layer 120 and the conductive via-filling plug 122.

It can thus be seen that a need exists for improved dual damascene processing techniques that provide improved electrical connections in vias.

BRIEF SUMMARY OF THE INVENTION

The present invention, in an exemplary embodiment, makes advantageous use of the reducing properties of hydrogen plasma to avoid the above-described disadvantages in the prior art. According to an exemplary embodiment of the present invention, a hydrogen plasma is applied after the barrier layer is opened in dual damascene process integration. Currently known methods for opening barrier layers suffer from the disadvantage that they cause at least some of the underlying copper to oxidize to copper oxide. Because copper oxide is selectively removed by subsequent wet cleaning, voids can form where damaged copper (e.g., copper oxide) is removed, thus compromising the reliability of metal-to-metal contact in the via. The present invention advantageously overcomes this and other disadvantages of the prior art through the use of hydrogen plasma following the barrier layer opening step, which heals damaged copper (e.g., reduces copper oxide to copper), thus preventing and/or diminishing defects in subsequently formed metal-to-metal contacts in vias. In currently preferred embodiments, the application of the hydrogen plasma is carried out in the same substantially vacuum environment, most preferably in the same chamber, as the barrier layer opening step to minimize exposure of the copper to oxidation from ambient air and to simplify fabrication processes.

Following the hydrogen plasma etch step, wet cleaning selectively removes any remaining copper oxide and other contaminants in preparation for formation of the via-filling plug. Since the hydrogen plasma step heals (e.g., reduces copper oxide to copper) the damage to the copper caused by prior processing, less copper is removed by subsequent wet cleaning, and voids are less likely to form in the copper. As a result, improved electrical connection between the first level interconnect metal layer and the conductive plug filling the via is provided by the present invention.

Further advantages of the present invention will be more apparent to the ordinarily skilled artisan from the ensuing detailed description and accompanying drawings, which illustrate what are currently considered to be preferred embodiments of the invention.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1A:
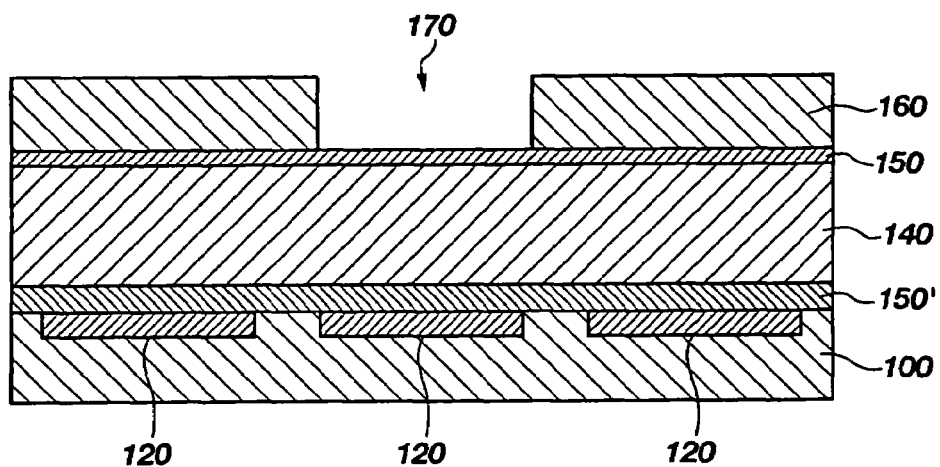
FIG. 1A is a cross-sectional view of a conventional dual damascene formation process for a semiconductor device at a preliminary stage of fabrication.
Figure 1B:
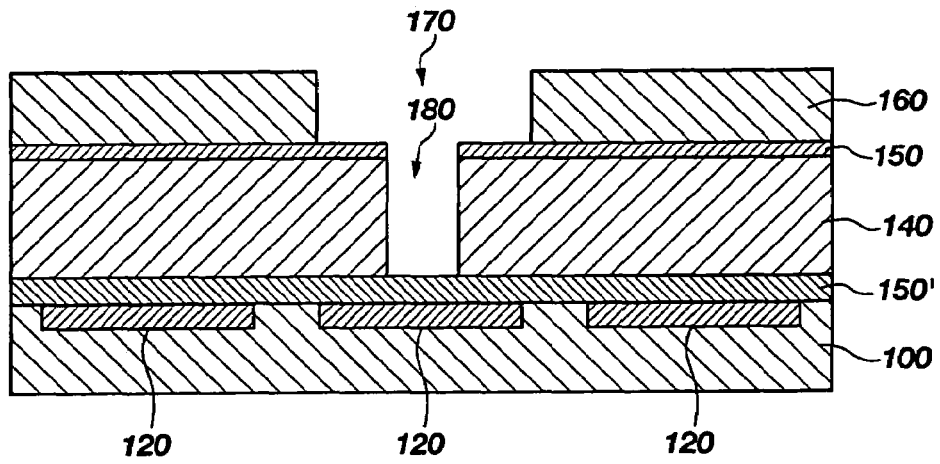
FIG. 1B is a cross-sectional view of the semiconductor device of FIG. 1A at a subsequent stage of production.
Figure 1C:
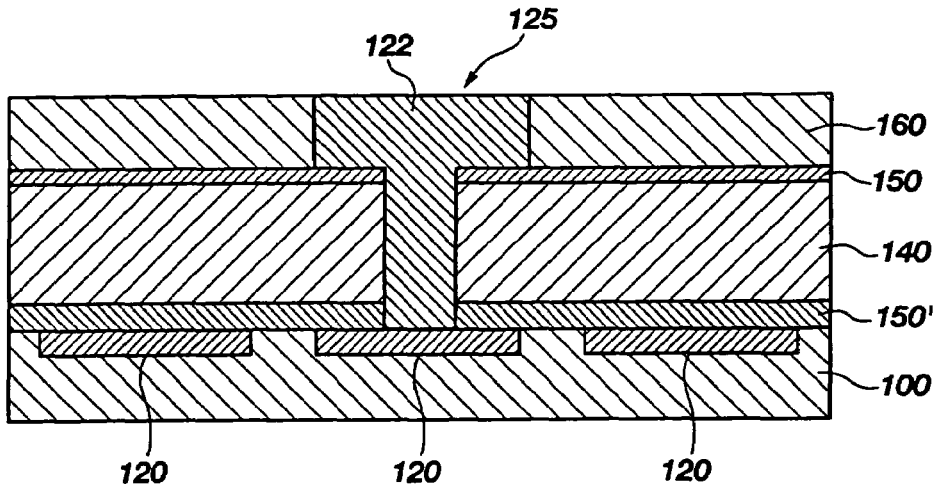
FIG. 1C is a cross-sectional view of the semiconductor device of FIG. 1B at a subsequent stage of production.
Figure 1D:
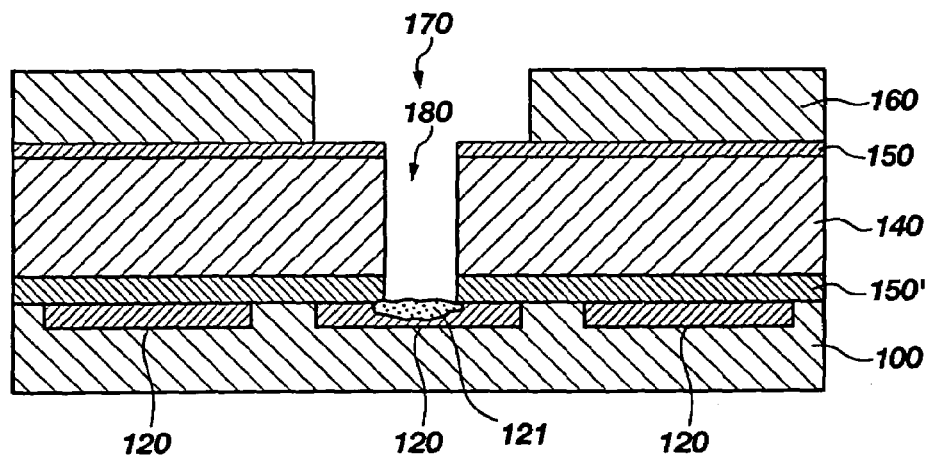
FIG. 1D is a cross-sectional view of the semiconductor device of FIG. 1B at a subsequent stage of production.
Figure 1E:
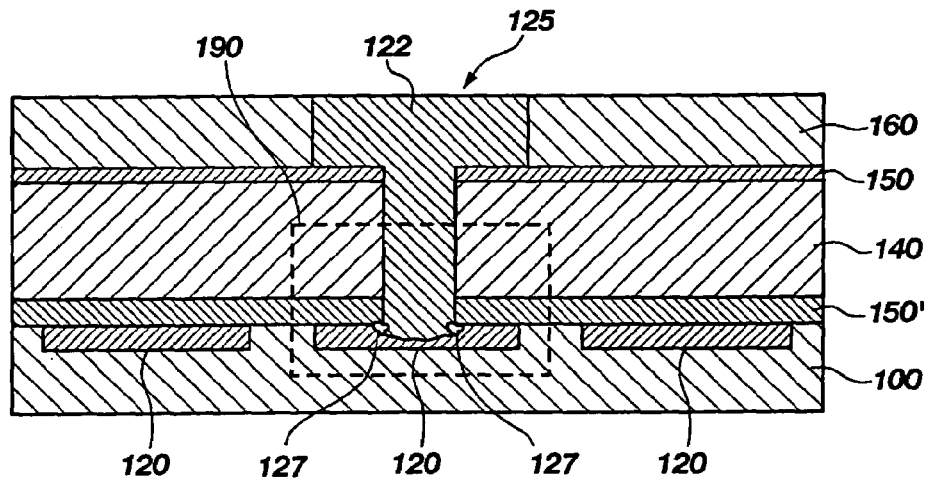
FIG. 1E is a cross-sectional view of the semiconductor device of FIG. 1D at a subsequent stage of production.
Figure 1F:
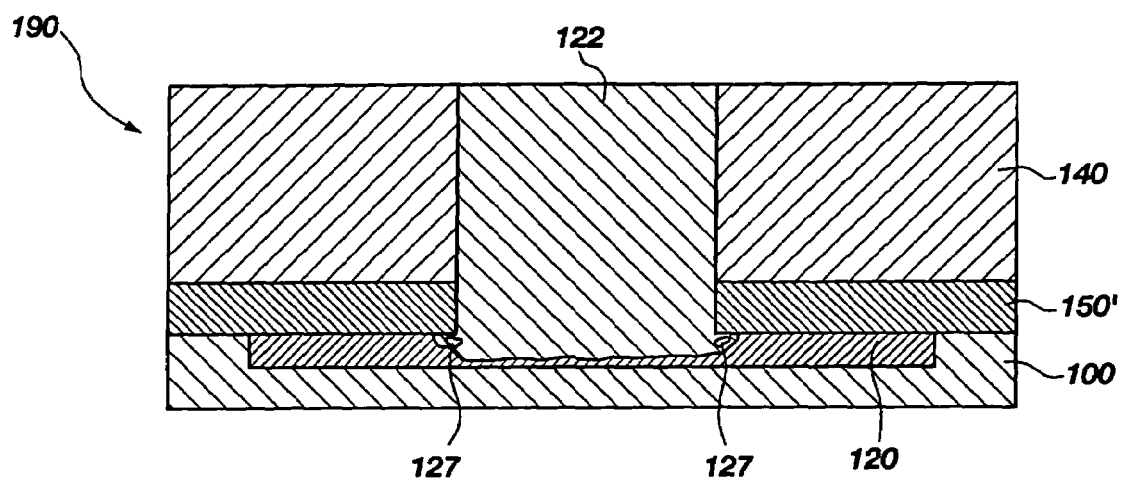
FIG. 1F is a detail view of the region indicated at 190 in the semiconductor device of FIG. 1E.

In the following detailed description, reference is made to various specific embodiments in which the invention may be practiced. These embodiments are described with sufficient detail to enable those skilled in the art to practice the invention, but it is to be understood that other embodiments may be employed and structural and electrical changes may be made without departing from the spirit or scope of the present invention. Currently known methods for forming dual damascene structures are described herein in conjunction with the description of the currently preferred embodiments, but the present invention is intended to subsume all methods currently known or discovered in the future for forming dual damascene structures and other like structures and structures requiring like processing.

The term "substrate" used in the following description may include any semiconductor-based structure that has a semiconductor surface. The term should be understood to include silicon, silicon-on-insulator (SOI), silicon-on-sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a "substrate" in the following description, previous process steps may have been utilized to form regions or junctions in or on the base semiconductor or foundation.

The term "copper," as used herein, is intended to include not only elemental copper, but also copper with other trace metals or in various alloyed combinations with other metals as known in the art, as long as such alloy retains the physical and chemical properties of copper. The term "copper" is also intended to include conductive oxides of copper.

In copper dual damascene etch processes, great care is taken to minimize physical and chemical damage to the lower copper surface. Nonetheless, chemical damage (e.g., oxidation) is unavoidable with known etching techniques. The present invention provides a way to heal surface chemical damage at the end of the dual damascene structure formation loop by applying a hydrogen plasma after the barrier layer removal step exposes the underlying copper layer.

The barrier layer removal step conventionally uses mixtures of fluorocarbons and oxygen to open the barrier layer and expose the underlying copper layer for the second metallization step (e.g., formation of a via-filling plug). If the copper surface is oxidized, it can be removed by subsequent wet clean chemistries applied prior to metallization, thus giving rise to greater potential for compromised reliability in metal-to-metal connection in the via.

According to the present invention, a hydrogen plasma is applied after the barrier layer opening step of the etch process to reduce damaged copper (e.g., copper oxide) to copper and thereby heal damage to the copper layer. In currently preferred embodiments, the application of the hydrogen plasma is carried out in the same substantially vacuum environment, more preferably in the same chamber, as the barrier layer removal step to minimize exposure to oxidation from ambient air and to simplify fabrication processes. In this way, the amount of damaged copper removed during wet cleaning is minimized, and the potential for undercutting of copper from beneath the barrier layer (e.g., resulting in the formation of voids) is diminished. As a result, the present invention helps improve metal-to-metal contact in vias in damascene structures formed according to the methods of the invention.

Rather than removing damaged copper (e.g., copper oxide) formed during the barrier layer opening step, the damaged copper is healed (e.g., reduced) by the methods according to the invention. Consequently, subsequent wet cleaning removes less copper material, thus improving the reliability of metal-to-metal connection formed in the via.

Conventional etchants used to open the barrier layer damage the underlying copper layer through, for example, oxidation. Oxidizing ions in conventional etchants strike the copper layer during barrier layer removal, thereby oxidizing the copper to copper oxide. The present invention overcomes the disadvantages of the prior art by healing this damage to the copper layer. In currently preferred embodiments, a hydrogen plasma is applied before a wafer is removed from the vacuum environment in which the barrier layer removal step is performed. The hydrogen plasma can be applied in the same chamber as the barrier layer removal step is performed or in a different chamber. It is currently preferred to apply the hydrogen plasma in the same chamber as the barrier layer removal step is performed in order to minimize the exposure of the wafer to ambient air, which can oxidize the copper to copper oxide. In this way, damaged copper (e.g., copper oxide) is healed (e.g., reduced), and further damage is prevented.

The hydrogen plasma can additionally include inert gases, such as argon and nitrogen, to facilitate contact between hydrogen ions and the damaged copper (e.g., copper oxide). The exposure to the hydrogen plasma is preferably in the range of 10 to 60 seconds, more preferably in the range of 10 to 30 seconds. The ordinarily skilled artisan will be able to determine the appropriate duration of the hydrogen plasma exposure in view of the composition of the plasma and the materials of the wafer being treated.

The pressure of the hydrogen plasma must be sufficient to create good plasma density, for example, about 100 milliTorr. The energy for the reaction comes from the reduction process, so temperature does not have a significant impact on reaction rate.

According to current belief, the present invention may be used with metal layers of copper, as well as quasi-noble metals that have less stable oxides, such as, for example, palladium, platinum, nickel, copper, gold, silver, and cobalt, since oxides of these metals are easily reducible.

Figure 2A:
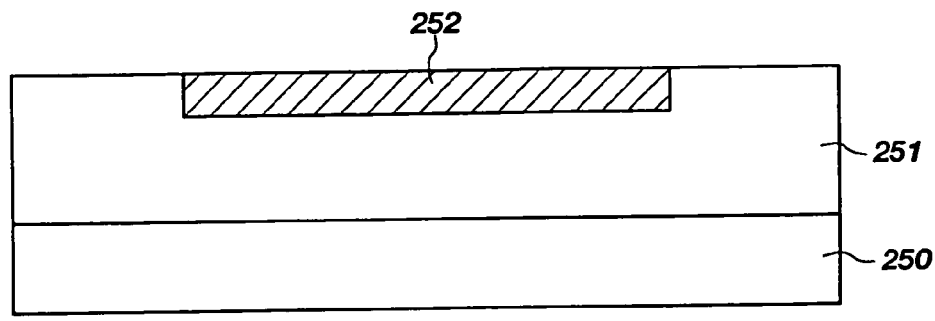
FIG. 2A is a cross-sectional view of a dual damascene formation process for a semiconductor device according to the present invention at a preliminary stage of fabrication.

FIGS. 2A-2K are cross-sectional views illustrating a sequence of fabrication steps for forming a dual damascene copper interconnect in association with a semiconductor device according to the teachings of the present invention. FIG. 2A depicts a portion of an insulating layer 251 formed over a semiconductor substrate 250, on or within which a metal layer 252 has been formed. The metal layer 252 may also be formed on or in the substrate 250. The metal layer 252 represents a lower metal interconnect layer which is to be later interconnected with an upper metal interconnect layer. The metal layer 252 may be formed of copper (Cu), for example, but other conductive materials, such as palladium, platinum, nickel, copper, gold, silver, and cobalt and their alloys, may be used also.

Figure 2B:
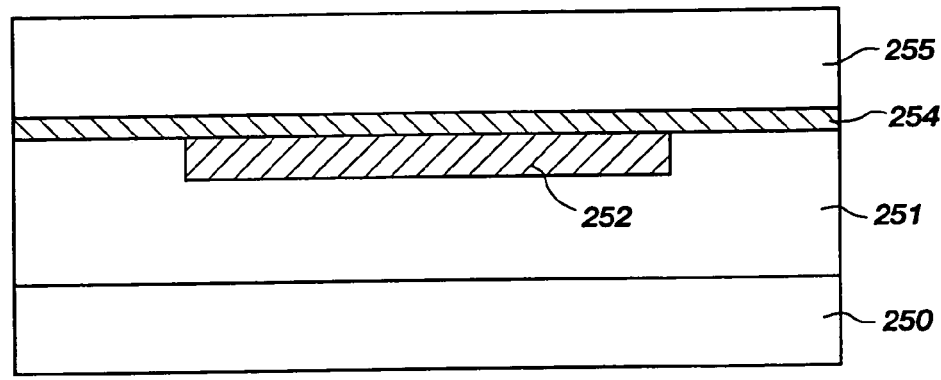
FIG. 2B is a cross-sectional view of the semiconductor device of FIG. 2A at a subsequent stage of production.

FIG. 2B illustrates the structure following the next series of processing steps. As shown in FIG. 2B, a barrier layer 254 and a first intermetal insulating layer 255 are formed overlying the insulating layer 251 and the metal layer 252. In an exemplary embodiment of the present invention, the first intermetal insulating layer 255 is blanket deposited by spin coating to a thickness of about 2,000 Angstroms to 15,000 Angstroms, more preferably of about 6,000 Angstroms to 10,000 Angstroms. The first intermetal insulating layer 255 may be cured at a predefined temperature, depending on the nature of the material. Other known deposition methods, such as chemical vapor deposition (CVD), plasma enhanced CVD (PECVD), or physical vapor deposition (PVD), may also be used for the formation of the first intermetal insulating layer 255, as appropriate for a given circumstance.

In one embodiment, the first intermetal insulating layer 255 is formed of a conventional insulating oxide, such as silicon oxide ($SiO_2$). In alternative embodiments, the first intermetal insulating layer 255 is formed of a low dielectric constant material such as, for example, polyimide, spin-on-polymers (SOP), parylene, flare, polyarylethers, polytetrafluoroethylene, benzocyclobutene (BCB), SILK, fluorinated silicon oxide (FSG), NANOGLASS® or hydrogen silsesquioxane, among others. The present invention is not limited, however, to the above-listed materials, as other insulating and/or dielectric materials known in the industry may also be used.

Figure 2C:
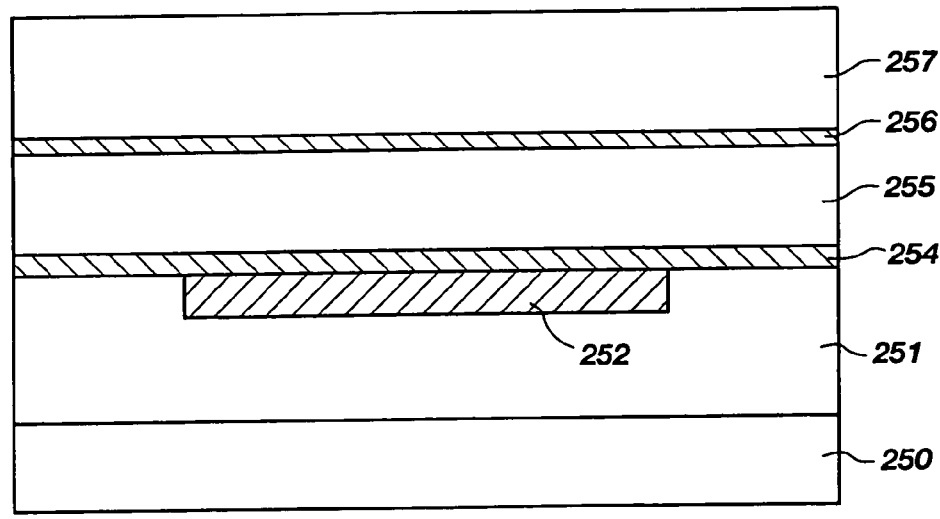
FIG. 2C is a cross-sectional view of the semiconductor device of FIG. 2B at a subsequent stage of production.

FIG. 2C illustrates the structure following the next series of processing steps. As shown in FIG. 2C, a second intermetal insulating layer 257 is formed overlying an optional etch stop layer 256. According to the present invention, the second intermetal insulating layer 257 can be formed, for example, by deposition to a thickness of about 2,000 Angstroms to about 15,000 Angstroms, more preferably of about 6,000 Angstroms to 10,000 Angstroms. Other deposition methods, such as the ones mentioned above with reference to the formation of the first intermetal insulating layer 255, can also be used. The second intermetal insulating layer 257 can be formed of the same material used for the formation of the first intermetal insulating layer 255 or a different material.

The optional etch stop layer 256 and the barrier layer 254 can be formed of any appropriate etch stop material, such as, but not limited to, silicon nitride ($Si_3N_4$).

Figure 2D:
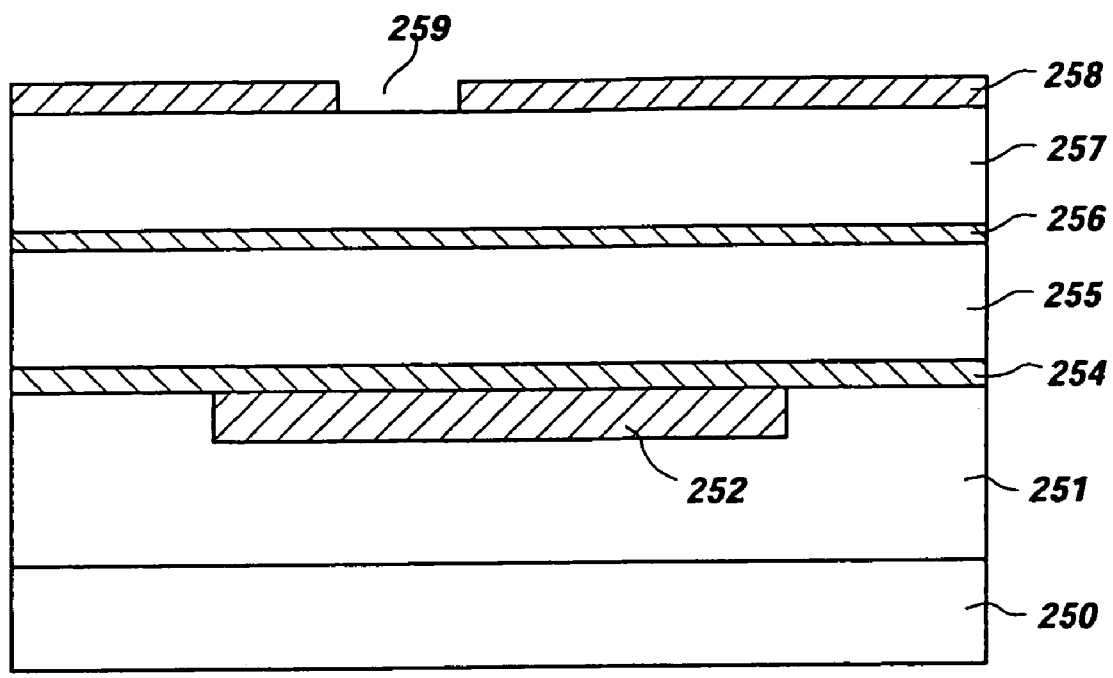
FIG. 2D is a cross-sectional view of the semiconductor device of FIG. 2C at a subsequent stage of production.

FIG. 2D illustrates the structure following the next series of processing steps in a "via first" approach to dual damascene process integration. It is to be noted that the present invention is not limited to such a "via first" approach but, rather, is intended to include all methods, currently known or hereafter discovered, for forming damascene structures and structures requiring like processing. As shown in FIG. 2D, a first photoresist layer 258 is formed over the second intermetal insulating layer 257. In exemplary embodiments, the first photoresist layer 258 is formed to a thickness of about 2,000 Angstroms to about 3,000 Angstroms. The first photoresist layer 258 is then patterned with a mask (not shown) having images of a via pattern 259.

Figure 2E:
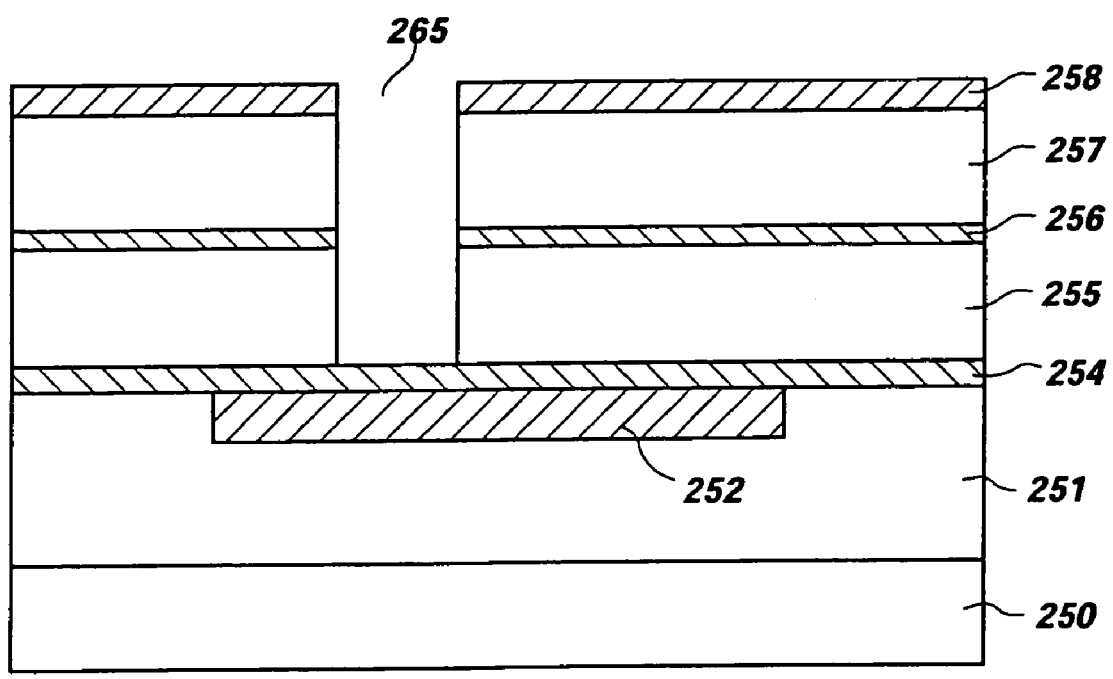
FIG. 2E is a cross-sectional view of the semiconductor device of FIG. 2D at a subsequent stage of production.

Thus, as shown in FIG. 2E, a via 265 can be formed by etching through the first photoresist layer 258 and into the second intermetal insulating layer 257 with a first etchant, subsequently etching through optional etch stop layer 256 and into the first intermetal insulating layer 255 with a second etchant, followed by a subsequent barrier layer removal step comprising etching through barrier layer 254. Removal of the barrier layer 254 is performed at a stage after the trench 267 (see FIG. 2G) has been formed. As one of ordinary skill in the art will understand upon reading this disclosure, the etchants (not shown) may be selected in accordance with the characteristics of the first and second intermetal insulating materials 255, 257, optional etch stop layer 256, and barrier layer 254 so that the insulating materials are selectively etched until the second etchant reaches the metal layer 252.

Figure 2F:
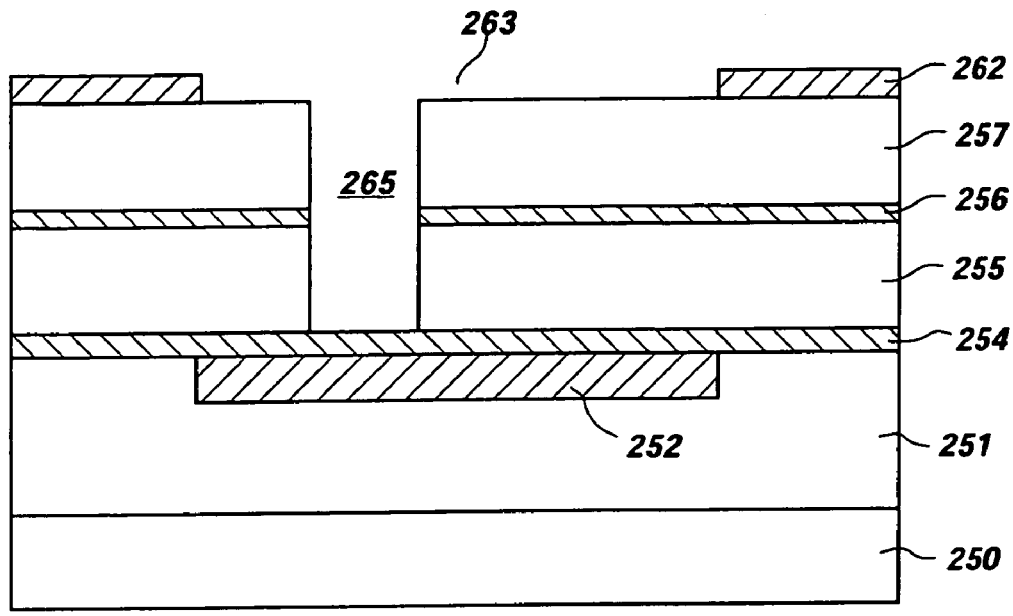
FIG. 2F is a cross-sectional view of the semiconductor device of FIG. 2E at a subsequent stage of production.
Figure 2G:
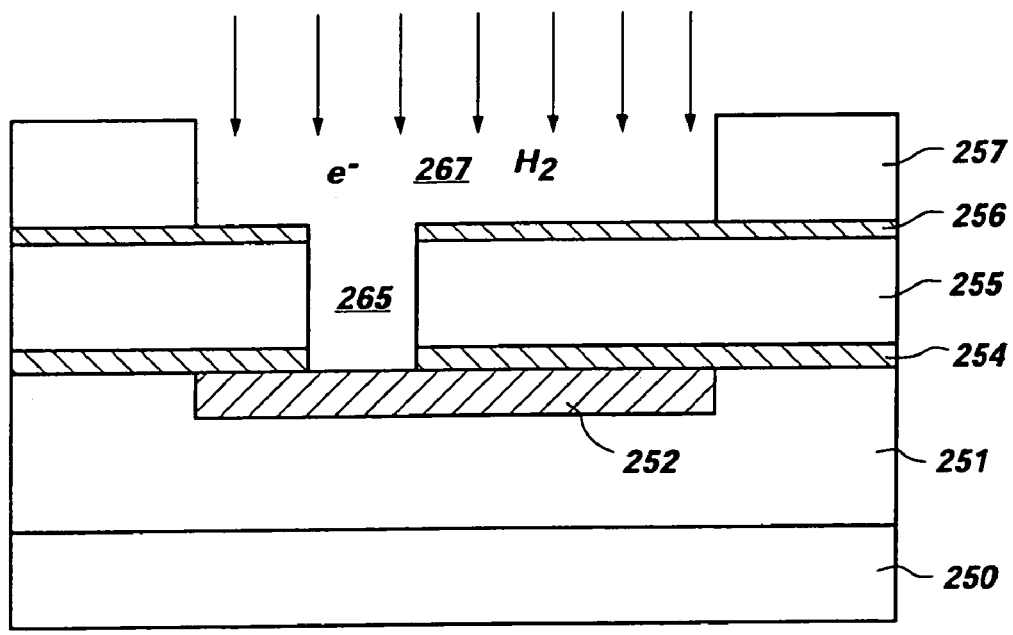
FIG. 2G is a cross-sectional view of the semiconductor device of FIG. 2F at a subsequent stage of production.

After the formation of the via 265 through the second and first intermetal insulating layers 257, 255 and optional etch stop layer 256, a trench 267, as shown in FIG. 2G, is formed by photolithography techniques, as shown in FIG. 2F. As shown in FIG. 2F, a second photoresist layer 262 is formed over the second intermetal insulating layer 257, preferably to a thickness of about 2,000 Angstroms to about 3,000 Angstroms, and then patterned with a mask (not shown) having images of a trench pattern 263. According to the present invention, the trench pattern 263 is then etched into the second intermetal insulating layer 257 using second photoresist layer 262 as a mask to form trench 267, as shown in FIG. 2G. The thickness of the first intermetal insulating layer 255 defines the depth of the via 265, as shown in FIGS. 2F-2G. The thickness of the second intermetal insulating layer 257 defines the depth of the trench 267 of FIG. 2G. As noted above, barrier layer 254 is removed after formation of trench 267.

The etching of the trench 267 may be accomplished using the same etchant employed to form the via 265, as shown in FIG. 2E, or a different etchant.

Figure 2H:
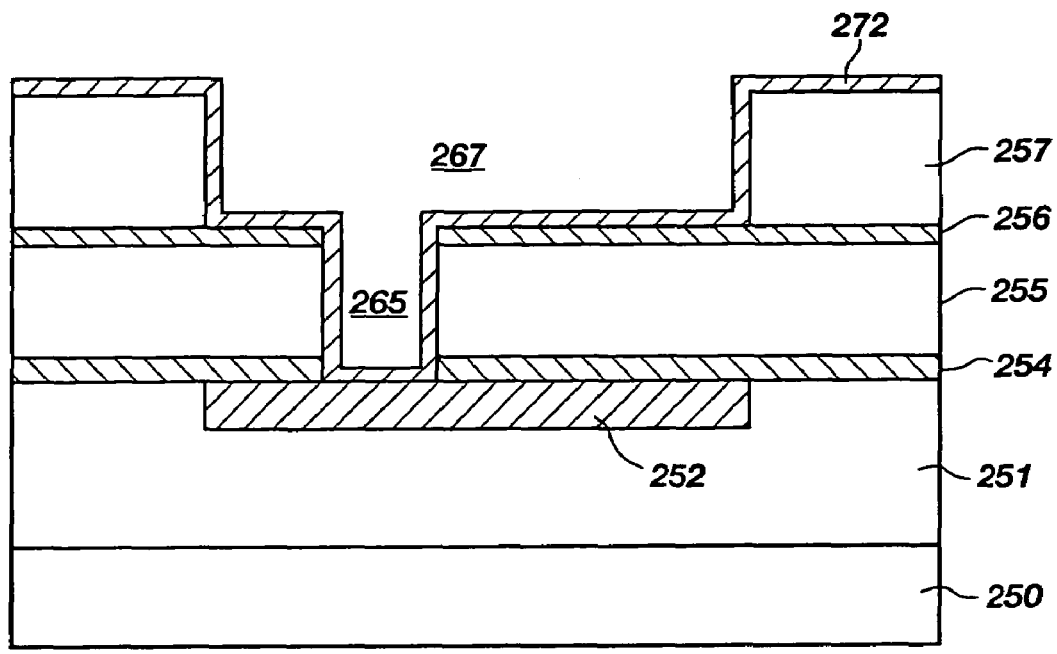
FIGS. 2H-2K are cross-sectional views illustrating a sequence of fabrication steps of an alternative embodiment of the invention.
Figure 2I:
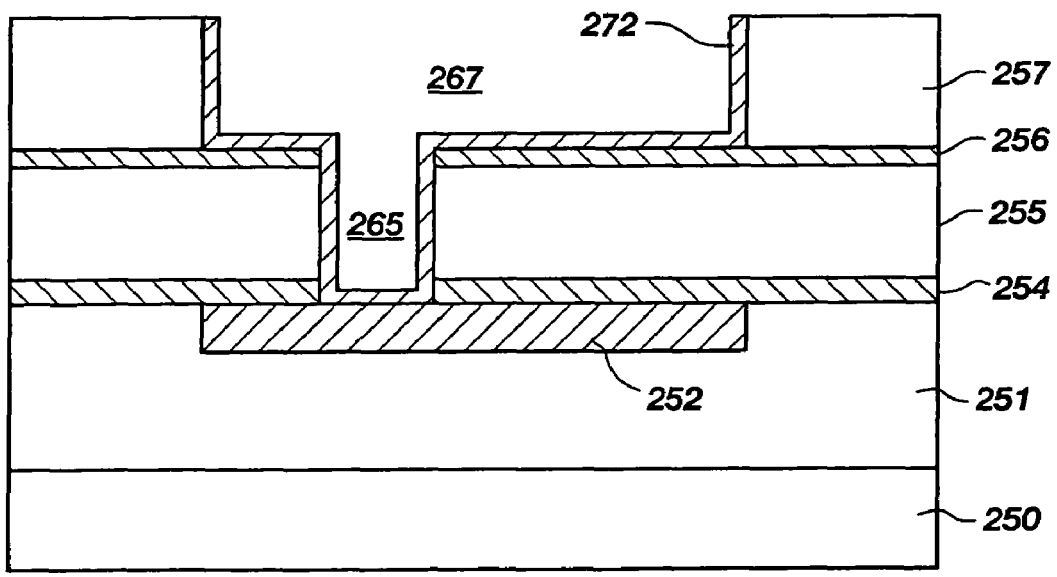
Figure 2J:
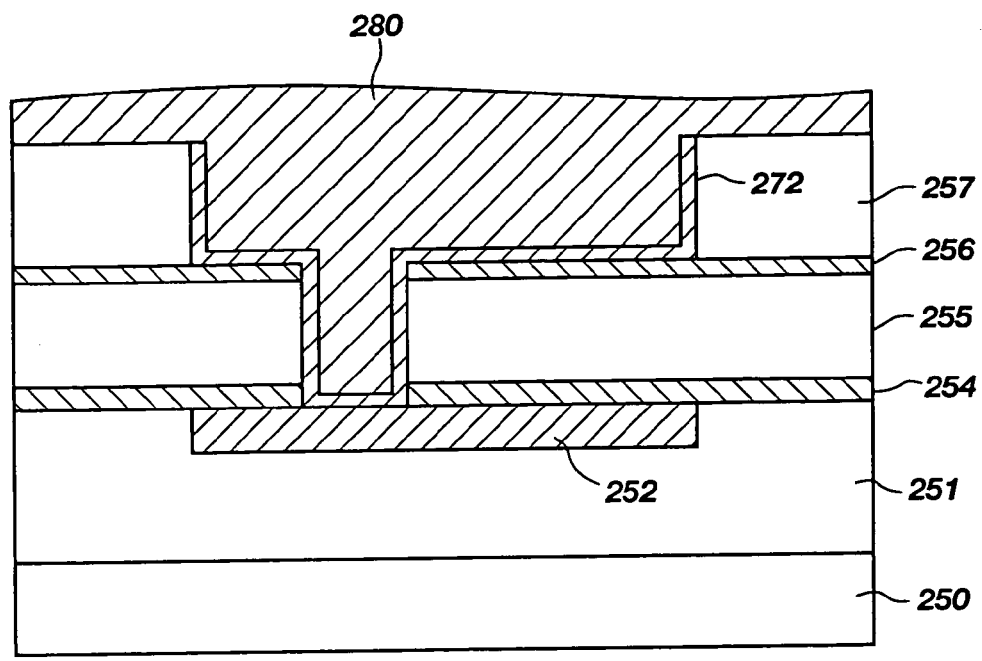
Figure 2K:
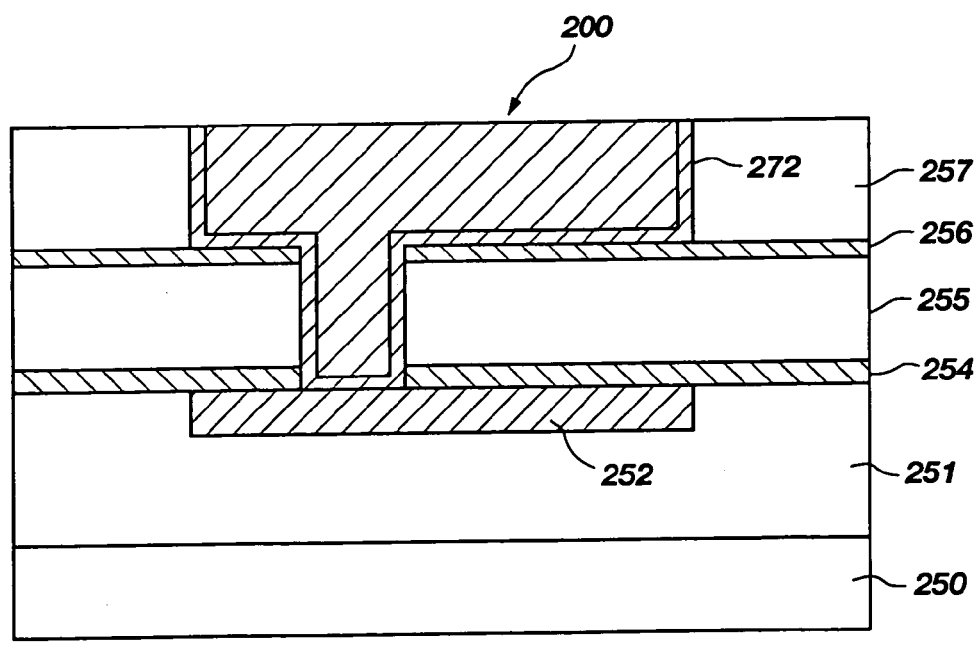

Subsequent to the formation of trench 267, the second photoresist layer 262 is removed so that further steps to create the copper dual damascene structure 200, shown in FIG. 2K, may be carried out.

Whether a "trench first" or a "via first" approach to damascene process integration is used, a reducing plasma is applied after barrier layer 254 is opened. FIG. 2G illustrates a hydrogen plasma being applied after barrier layer 254 is opened to reduce any copper oxide that may have formed from the metal layer 252 during prior processing. The hydrogen plasma is applied in the same substantially vacuum environment as the barrier layer removal step, preferably in the same chamber.

FIG. 2H illustrates the structure following the next sequence of fabrication steps in alternative embodiments of the present invention. FIGS. 2H-2K show a diffusion barrier layer 272 that may optionally be included in a semiconductor device made according to the present invention. As shown in FIG. 2H, a diffusion barrier layer 272 is formed on the via 265 and the trench 267 to a thickness of about 50 Angstroms to about 200 Angstroms, more preferably of about 100 Angstroms.

In one embodiment according to the teachings of the present invention, the diffusion barrier layer 272 is formed of tungsten-nitride ($WN_2$) by atomic layer deposition ("ALD"). One example of a method for depositing tungsten-nitride ($WN_2$) by atomic layer deposition is described in an article by Krause, J. W. et al., entitled "Atomic Layer Deposition of Tungsten Nitride Films Using Sequential Surface Reaction," *Journal of Electrochemical Soc.*, 147:3, 1175-81 (2000). According to the teachings of the invention, a thin layer of $WN_2$ prepared by ALD is used as the diffusion barrier layer 272 in building copper interconnects for semiconductor devices. According to one embodiment of the invention, the deposition of the tungsten nitride film as the diffusion barrier layer 272 is performed at a temperature of about 600 to 800 degrees Kelvin. In one embodiment according to the teachings of the present invention, a tungsten-nitride ($WN_2$) layer is formed as the diffusion barrier layer 272 such that the diffusion barrier layer 272 is less than five atomic layers thick. According to the teachings of the present invention, these atomic layers are so uniform that a vertical wall as well as a short sidewall obtain an equal thickness. In these embodiments, x-ray photoelectron spectroscopy depth profiling experiments evidence that the film diffusion barrier layer 272 has a $WN_2$ stoichiometry with low C and O impurity concentrations. Further, x-ray diffraction investigation reveals that the tungsten nitride films serving as the diffusion barrier layer 272 are microcrystalline. Atomic force microscopy measurements of the deposited film serving as the diffusion barrier layer 272 evidence a remarkably flat surface indicating smooth film growth for the diffusion barrier layer 272.

In one embodiment of the invention, the tungsten-nitride ($WN_2$) diffusion barrier layer 272 is simultaneously deposited in both the via 265 and the trench 267. However, the invention is not limited to this embodiment. Thus, in an alternative embodiment, the tungsten-nitride ($WN_2$) diffusion barrier layer 272 is deposited first in the via 265 before the formation of the trench 267, and then in the trench 267 after its respective formation. According to the teachings of the present invention, in the case of either embodiment, after the formation of the diffusion barrier layer 272, horizontal portions of the tungsten-nitride ($WN_2$) material, serving as the diffusion barrier layer 272, which formed above a top surface of the second intermetal insulating layer 257 are removed by either an etching or a polishing technique to form the structure illustrated in FIG. 2I. In one embodiment according to the teachings of the present invention, CMP is used to polish away excess tungsten-nitride ($WN_2$) material above the second intermetal insulating layer 257 and the trench 267 level. According to the teachings of the present invention, the second intermetal insulating layer 257 acts as a polishing stop layer when CMP is used.

FIG. 2J illustrates the structure following the next sequence of fabrication steps. As shown in FIG. 2J, a conductive material 280 comprising, for example, copper (Cu) is deposited to fill in both the via 265 and the trench 267. In one embodiment according to the teachings of the present invention, the copper is selectively deposited by chemical vapor deposition (CVD) at a low temperature. Some examples of methods for selective deposition of copper by CVD at low temperature are described in an article by Kaloyeros et al., entitled "Blanket and Selective Copper CVD From Cu(fod)$_2$ For Multilevel Metallization," *Mat. Res. Soc. Symp. Proc.*, Vol. 181 (1990), and in an article by Eisenbraun et al., entitled "Selective and Blanket Low-Temperature Copper CVD for Multilevel Metallization," *Materials Research Society Conference Proceedings*, ULSI-VII, 397-401 (1992), the disclosures of each of which are incorporated by reference herein.

In one embodiment according to the teachings of the present invention, copper films are deposited by selective CVD at a temperature of about 300-400° Celsius in an atmosphere of pure $H_2$ from the β-diketonate precursor bis (6,6,7,8,8,8-heptafluoro-2,2-dimethyl 1-3,5-octanedione) copper (II), Cu(fod)$_2$. In an alternative embodiment according to the teachings of the present invention, copper films are deposited by selective CVD at a temperature of about 300-400° Celsius in an atmosphere of pure $H_2$ or Ar from the β-diketonate precursor bis (6,6,7,8,8,8-heptafluoro-2,2-dimethyl 1-3,5-octanedione) copper (II), Cu(fod)$_2$. According to the teachings of the present invention, the reactor is first pumped down to a base pressure of less than $5 \times 10^{-7}$ Torr. Then, the source compound is introduced into the sublimator, which is heated to between 40 and 75° Celsius. A mass flow controller is employed to control the flow of the mixed gas precursor into the reactor. Deposition is carried out using argon and hydrogen as carrier gases. According to the teachings of the present invention, the substrates are heated from 300 to 400° Celsius. The pressure during deposition ranges between 1 and 10 Torr, and gas flow ranges from 30 to 55 sccm.

Since the temperatures involved in the embodiments of the present invention are relatively low, any low-k dielectric material, including polymers, which can withstand the above temperature range (300-400° C.), can be readily used with this technology as interlayer dielectrics, e.g., the first and second intermetal insulating layers 255, 257.

FIG. 2K illustrates the structure following the next sequence of fabrication steps. According to the teachings of the present invention, as shown in FIG. 2J, after the deposition of the conductive material 280, excess material formed above the surface of the second intermetal insulating layer 257 may be removed by either an etching or a polishing technique to form the copper dual damascene structure indicated generally at 200 in FIG. 2K. In one embodiment of the present invention, CMP is used as the technique to polish away excess conductive material above the second intermetal insulating layer 257 and the trench 267 level. In this manner, the second intermetal insulating layer 257 acts as a polishing stop layer when CMP is used.

As one of ordinary skill in the art will appreciate upon reading this disclosure, the above-described embodiments for selectively depositing conductive material 280 by chemical vapor deposition (CVD) at a low temperature, according to the teachings of the present invention, helps to reduce the amount of wasted copper in the process.

According to the teachings of the present invention, the selective deposition of copper by CVD described above is not the only method that can be employed for depositing the conductive material 280. According to another embodiment of the invention, copper can be selectively deposited by an electroless plating technique. In some instances, an electroless plating technique is more attractive than conventional electroplating methods. For example, in some embodiments, electroless plating is more advantageous than electroplating because of the low cost of tools and materials. An example of a study for electroless plating is provided in an article by Shacham-Diamand et al., entitled "Copper Electroless Deposition Technology for Ultra-Large-Scale-Integration (ULSI) Metallization," Microelectronic Engineering, Vol. 33, pp. 47-48 (1997), the disclosure of which is incorporated by reference herein. As will be understood by one of ordinary skill in the art upon reading this disclosure, electroless plating has a very high selectivity, excellent step coverage and good via/trench filling because of the very thin seed layers formed by the electroless plating method.

In the article by Shacham-Diamand et al., three practical seeding methods for the electroless deposition of copper, which can be used with the present invention, are presented. The three practical seeding methods for the electroless deposition of copper are: (1) noble metal seeding, typically on gold, palladium or platinum; (2) copper seeding using an aluminum sacrificial layer; and (3) wet activation of surfaces using a contact displacement method. The article by Shacham-Diamand et al. demonstrates the successful use of the third method to deposit copper on Ti/TiN or TiN/AlCu at room temperature.

Although only one copper dual damascene structure, e.g., structure 200, is shown in FIG. 2K, it will be readily apparent to those skilled in the art that, in fact, any number of such copper dual damascene structures may be formed on a substrate. Further, although the exemplary embodiments described above refer to the formation of copper dual damascene structures, the present invention is further applicable to other types of damascene structures, such as, but not limited to, those formed from palladium, platinum, nickel, copper, gold, silver, or cobalt (including alloys of the same).

Figure 3:
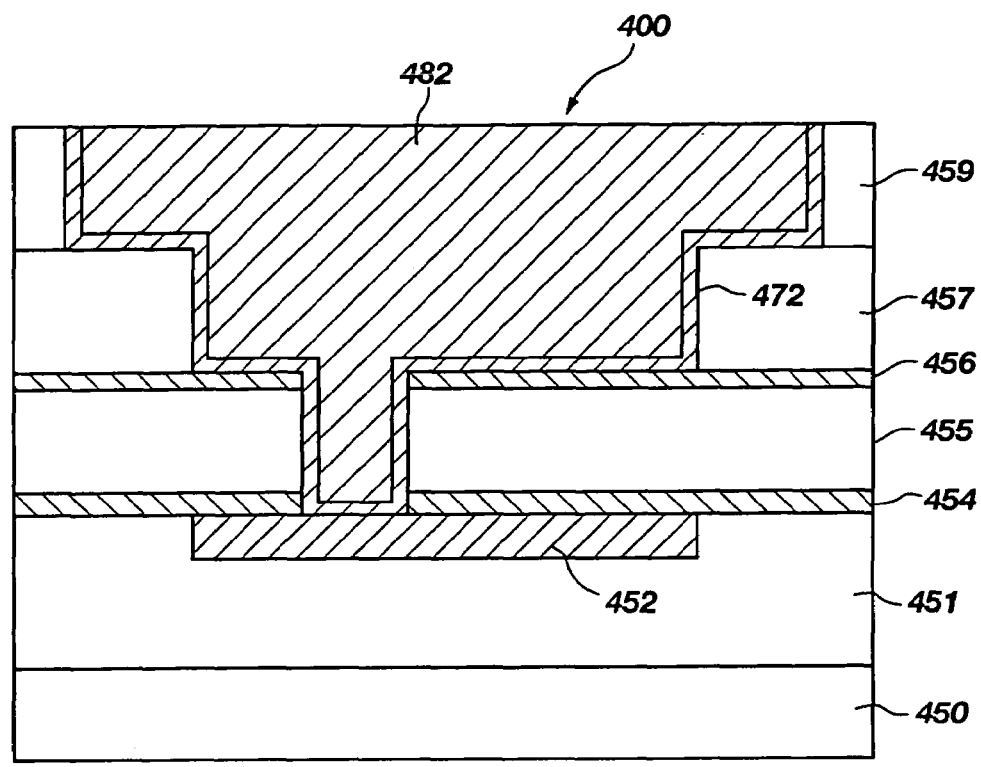
FIG. 3 is a cross-sectional view illustrating yet another embodiment of the invention.

FIG. 3 thus illustrates an embodiment, according to the teachings of the present invention, for a triple damascene structure 400. The triple damascene structure 400, shown in FIG. 3, follows the same processing steps described above in connection with FIGS. 2A-2K. Thus, the triple damascene structure 400 of FIG. 3 may optionally include a tungsten-nitride ($WN_2$) material, serving as a diffusion barrier layer 472 and copper 482 selectively deposited by the methods described in detail above. For example, FIG. 3 illustrates a triple damascene structure 400 with three intermetal insulating layers 455, 457, and 459 (which can comprise the same or different insulating materials), etch stop layers 454, 456, and metal layer 452 formed in insulating layer 451 formed over the substrate 450 and in which vias 465 (not shown) and trenches 467 (not shown) have been formed and then simultaneously filled with the selectively deposited copper 482 by the methods described above.

As one of ordinary skill in the art will understand from reading this disclosure, further steps to create a functional memory cell or other integrated circuit component having the interconnects of the present invention can be carried out. Hence, additional multilevel interconnect layers and associated dielectric layers can be formed to create operative electrical paths from any of the copper damascene structures 200, 400 to appropriate regions of a circuit integrated on a substrate.

Figure 4:
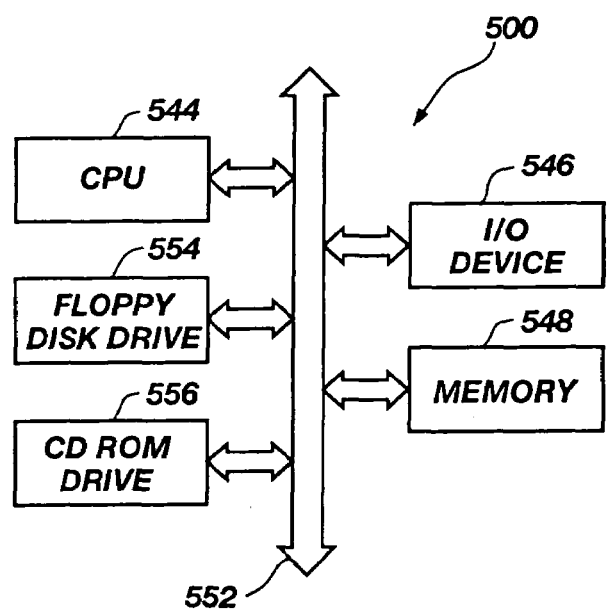
FIG. 4 illustrates an electronic system having a memory cell with a copper damascene structure according to the invention.

FIG. 4 illustrates an embodiment of an electronic system 500 having such a memory cell with a copper damascene structure according to the present invention. As shown in FIG. 4, the electronic system 500 is a processor-based 544 system which includes a memory circuit 548, for example a DRAM. According to the teachings of the present invention, either the processor 544, the memory circuit 548, or both contain damascene structures, such as the copper damascene structures described in connection with FIGS. 2A-2K and 3. The electronic system 500 shown in FIG. 4 illustrates generally a computer system 500. Such a computer system 500 generally comprises a central processing unit (CPU) 544, such as a microprocessor, a digital signal processor, or other programmable digital logic devices, which communicates with an input/output (I/O) device 546 over a bus 552. The memory circuit 548 communicates with the computer system 500 over bus 552.

In the case of a computer system 500, the processor-based system may include peripheral devices such as a floppy disk drive 554 and a compact disc CD-ROM drive 556, which also communicates with CPU 544 over the bus 552. According to the teachings of the present invention, memory circuit 548 can be constructed as an integrated circuit, including one or more copper damascene structures as described above in connection with FIGS. 1A-1F, 2A-2K, and 3, at reference numerals 125, 200, 400, respectively. In one embodiment according to the teachings of the present invention, the memory circuit 548 and the processor, for example CPU 544, can be formed on a single chip as a single integrated circuit.

Although the present invention has been described with respect to the illustrated embodiments, various additions, deletions and modifications are contemplated as being within its scope. The scope of the invention is, therefore, indicated by the ensuing claims, rather than the foregoing description. All changes that come within the meaning and range of equivalency of the claims are to be embraced within their scope.

What is claimed is:

1. A method for forming a metallic damascene structure, comprising:
    forming a damascene opening to expose a metallic layer in a damascene structure, forming a damascene opening comprising exposing at least a portion of the metallic layer to an oxidizing agent, the oxidizing agent causing an oxidation injury to the at least a portion of the metallic layer;
    exposing the metallic layer to a reducing plasma to at least partly reverse the oxidation injury;
    applying a cleaning process to the damascene structure; and
    forming a metallic plug in the damascene opening, the metallic plug in electrical connection with the metallic layer.

2. The method according to claim 1, further comprising forming the metallic layer from copper.

3. The method according to claim 1, further comprising forming the metallic layer from a metal having an easily reducible oxide.

4. The method according to claim 1, further comprising forming the metallic layer from at least one metal selected from the group consisting of palladium, platinum, nickel, copper, gold, silver, and cobalt.

5. The method according to claim 1, further comprising generating the reducing plasma as a hydrogen plasma.

6. The method according to claim 5, further comprising generating the hydrogen plasma to include at least one inert gas.

7. The method according to claim 6, further comprising selecting the at least one inert gas from at least one of argon and nitrogen.

8. The method according to claim 2, wherein the oxidation injury comprises formation of copper oxide.

9. The method according to claim 8, further comprising at least partly reversing the oxidation injury by reducing the copper oxide to copper.

10. The method according to claim 1, wherein forming a metallic plug in the damascene opening comprises forming a metallic plug that passes through a first intermetal insulating layer and a second intermetal insulating layer.

11. The method according to claim 1, wherein forming a metallic plug in the damascene opening comprises forming a metallic plug that passes through a first intermetal insulating layer, a second intermetal insulating layer, and a third intermetal insulating layer.

12. The method according to claim 1, wherein forming a metallic plug in the damascene opening comprises forming a metallic plug that passes through a plurality of intermetal insulating layers.

13. The method according to claim 1, wherein exposing the metallic layer to the reducing plasma is carried out in an environment in which forming the damascene opening is carried out.

14. The method according to claim 13, wherein the environment comprises a chamber.

15. The method according to claim 14, further comprising operating the chamber in a substantially vacuum environment.

16. The method according to claim 1, wherein forming the damascene opening and exposing the metallic layer to the reducing plasma are carried out in an environment having less oxygen than ambient air.

17. The method according to claim 1, wherein exposing the metallic layer to the reducing plasma is for about 10 to about 60 seconds.

18. The method according to claim 1, wherein exposing the metallic layer to the reducing plasma is for about 10 to about 30 seconds.

19. The method according to claim 1, further comprising providing the reducing plasma at a pressure of about 100 milliTorr.

20. The method according to claim 1, further comprising forming a diffusion barrier layer over the damascene structure before forming the metallic plug.

21. The method according to claim 20, further comprising forming the diffusion barrier layer to include tungsten-nitride.

22. The method according to claim 1, further comprising conducting the cleaning process as a wet cleaning process.

23. The method according to claim 22, further comprising conducting the wet cleaning process employing aqueous dilute hydrofluoric acid.

24. The method according to claim 1, further comprising forming the metallic plug to comprise the same metal as the metallic layer.

25. The method according to claim 1, further comprising forming the metallic plug to comprise copper.

* * * * *